United States Patent [19]

Shah

[11] Patent Number: 5,379,255
[45] Date of Patent: Jan. 3, 1995

[54] THREE DIMENSIONAL FAMOS MEMORY DEVICES AND METHODS OF FABRICATING

[75] Inventor: Pradeep L. Shah, Dallas, Tex.

[73] Assignee: Texas Instruments Incorporated, Dallas, Tex.

[21] Appl. No.: 990,564

[22] Filed: Dec. 14, 1992

[51] Int. Cl.⁶ .................. H01L 29/78; H01L 27/10
[52] U.S. Cl. .................. 365/185; 365/182; 437/52; 437/56; 437/59
[58] Field of Search ............. 365/185, 182; 437/52, 437/56, 59

[56] References Cited

U.S. PATENT DOCUMENTS 5,001,526 3/1991 Gotou .................. 365/23.6

FOREIGN PATENT DOCUMENTS 4-155870 4/1992 Japan.
4-192565 7/1992 Japan.

OTHER PUBLICATIONS

K. Sunouchi et al., "A Surrounding Gate Transistor(SGT) Cell for 64/256Mbit DRAMS", *IEEE, IEDM* 1989, pp. 2.1.1–2.1.4, (23–26).

Primary Examiner—Viet Q. Nguyen
Attorney, Agent, or Firm—Dennis W. Braswell; Leo N. Heiting; Richard L. Donaldson

[57] ABSTRACT

Memory cell transistors are provided in which pillar structures or column structures (12, 12a, 14, and 14a) are formed at the face of a semiconductor substrate (10). Floating gates (46) and control gates (52) are formed adjacent to the pillar structures or column structures (12, 12a, 14, and 14a). The floating gates (46) and control gates (52) are insulatively disposed by gate oxide layer (42) and insulating layer (50). Source regions (36, 40, and 48) are implanted in the semiconductor substrate (10). Drain regions (38) are also implanted in the pillar structures or column structures (12, 12a, 14 and 14a).

5 Claims, 5 Drawing Sheets

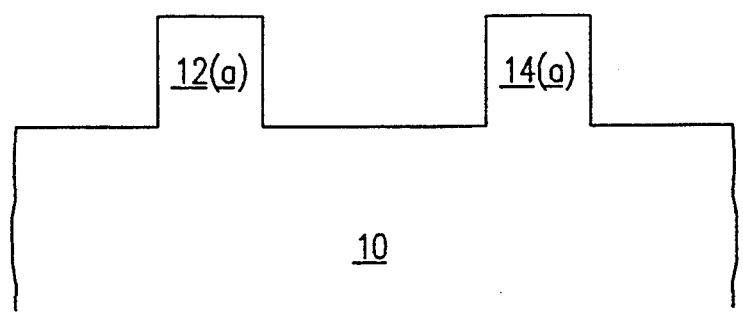
FIG. 1a
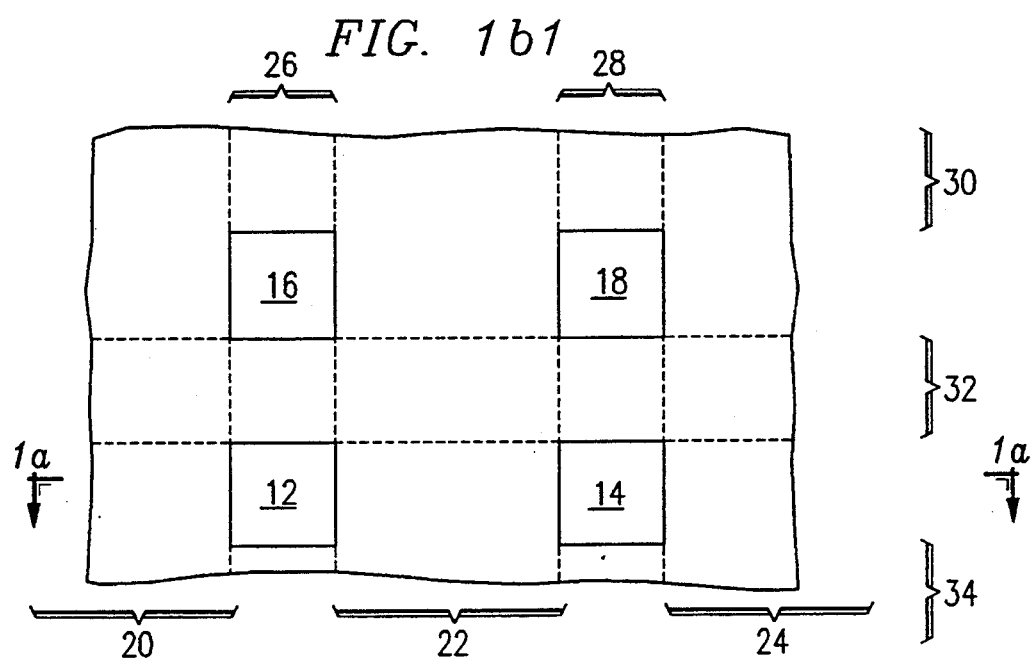
FIG. 1b1
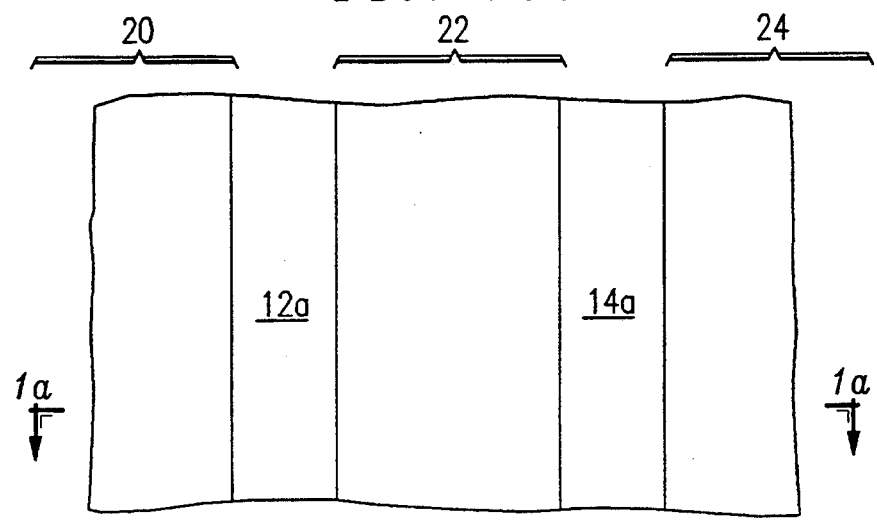
FIG. 1b2

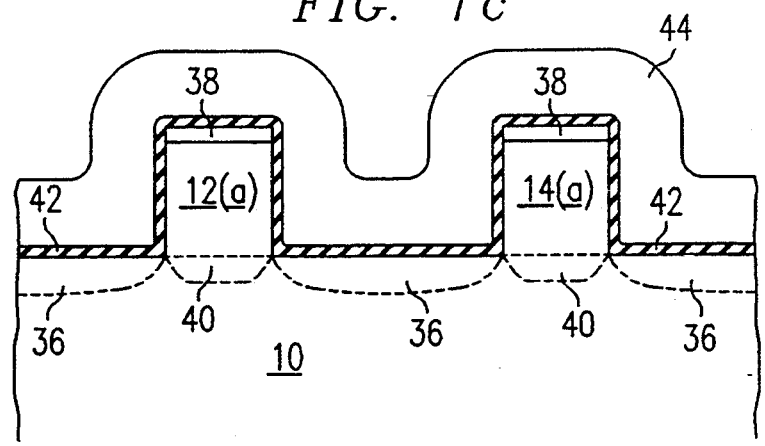
FIG. 1c
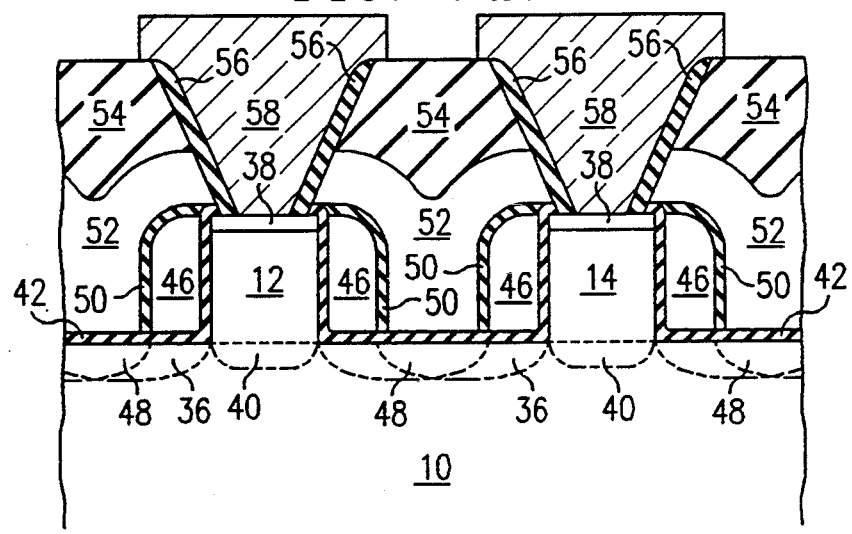
FIG. 1d1
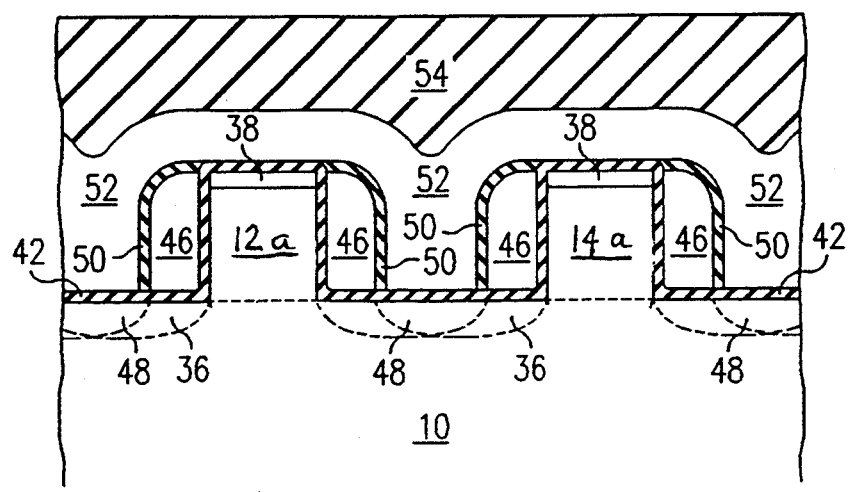
FIG. 1d2

THREE DIMENSIONAL FAMOS MEMORY DEVICES AND METHODS OF FABRICATING

TECHNICAL FIELD OF THE INVENTION

This invention relates generally to memory devices, and more particularly to three dimensional FAMOS memory devices and methods of fabricating.

BACKGROUND OF THE INVENTION

A significant goal in the fabrication of FAMOS memory cells, such as electrically erasable programmable read only memories (EEPROMs) and UV-erasable EPROMs, is the increase of memory cell density. In EEPROMs, data is stored in a floating gate of a memory cell transistor. Data is read from, written to (programmed), or erased from each memory cell transistor by placing various voltages on the sources, drains, and control gates of those transistors. In uv-erasable EPROMs, cells are erased by exposure to ultra-violet light.

With such memory cell transistors, memory density may be increased by reducing the size of each memory cell. Advances in memory design have reduced the size of each memory cell to the point that the limits of photolithographic techniques prevent further reduction of conventionally designed memory cells. Furthermore, reliable operation of memory cell transistors requires a minimum channel length between the source and drain of each memory cell transistor. Without that minimum channel length, reliability is degraded because of coupling between sources and drains. Finally, as memory cell transistors are reduced in size, the floating gate is accordingly reduced in size. The reliability of memory cells decreases as the size of the floating gate decreases.

Therefore, a need has arisen for a memory cell that is smaller in size than existing memory cells, and yet still provides reliable operation.

SUMMARY OF THE INVENTION

In accordance with the present invention, three dimensional FAMOS memory cells and methods of fabricating the same are provided which substantially eliminates or reduces disadvantages and problems associated with prior art memory cells.

In particular, a memory cell is provided which is formed at a semiconductor layer of a first conductivity type. A pillar is etched from the semiconductor layer, the pillar having a base at a face of the semiconductor layer. A source region is implanted into the face with a dopant to be of a second conductivity type opposite the first conductivity type. A drain region is implanted into the pillar with a dopant to be of a second conductivity type opposite said first conductivity type to define a channel area extending between the source and drain regions and within the pillar. A surrounding floating gate is formed insulatively surrounding the pillar and insulatively disposed over at least a part of the channel area. Furthermore, a control gate is insulatively disposed adjacent the surrounding floating gate.

In another embodiment, a memory cell is formed by forming a floating gate on only a portion of the sidewalls of a column structure. The floating gate is insulatively disposed over at least a portion of a channel area. A control gate is then insulatively disposed adjacent the floating gate. In this embodiment, a memory cell transistor is formed on the side of the column structure. Thus, other devices, such as other memory cells can be formed on the other side of the column. Furthermore, many memory cells can be formed along the column, by isolating between cells.

Methods of fabricating these memory cells, and arrays of these memory cells are also disclosed.

An important technical advantage of the present invention is the fact that memory cells are formed perpendicular to a semiconductor substrate face. Thus, channel areas are also substantially perpendicular to the face of the semiconductor substrate, resulting in significant area savings in the manufacture of memory devices. Another important technical advantage of the present invention is the fact that one or more memory cell transistors can be made on the same semiconductor structure that is substantially perpendicular to the face of a semiconductor substrate.

Still another important technical advantage of the present invention is that it provides for "contactless" memory cells, thus reducing complexity, since an array of such cells can be fabricated with contacts being necessary on the periphery of the array.

BRIEF DESCRIPTION OF THE DRAWINGS

For a more complete understanding of the present invention and the advantages thereof, reference is now made to the following description taken in conjunction with the accompanying drawings in which like reference numbers indicate like features wherein:

FIGS. 1a–1e2 illustrate schematic cross sectional views and plan views of processing steps for constructing representative memory cells according to the teachings of the present invention;

FIG. 2 is a plan view of a particular embodiment of a representative memory cell according to the teachings of the present invention;

DETAILED DESCRIPTION OF THE INVENTION

The preferred embodiments of the present invention are illustrated in FIGS. 1–5 of the drawings, like numerals being used to refer to like and corresponding parts of the various drawings.

Figure 2:
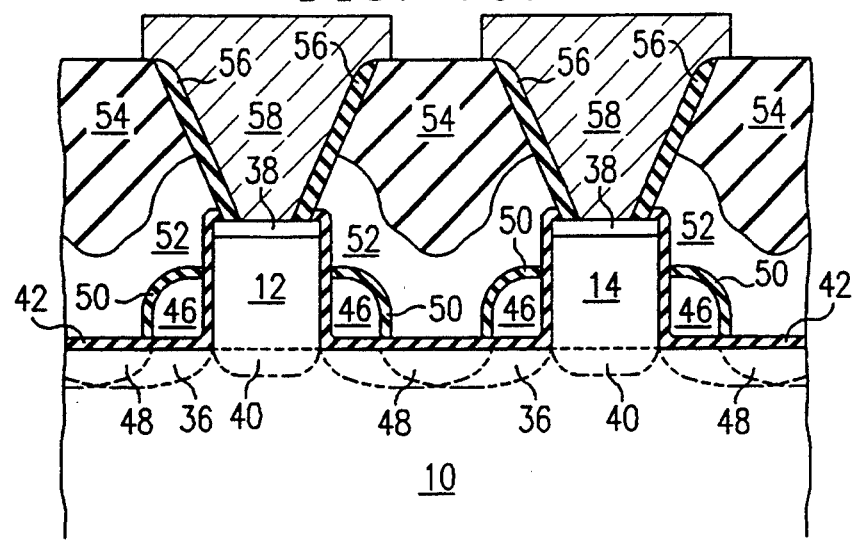
Figure 2:
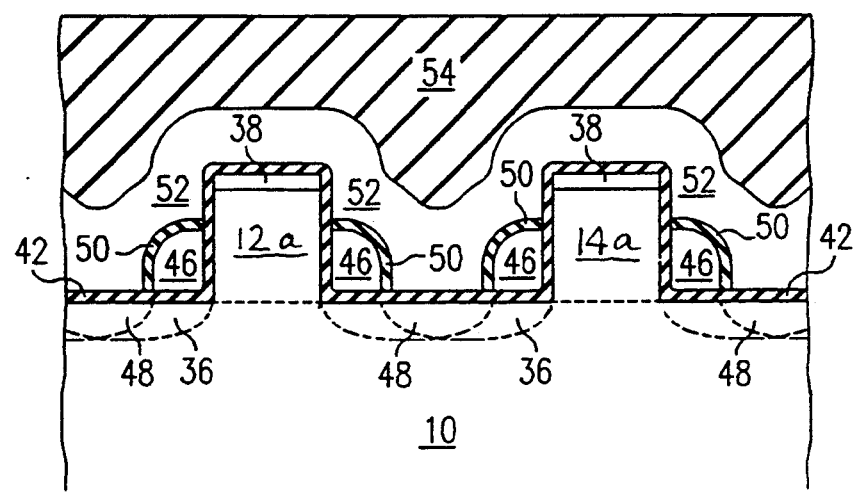
Figure 2:
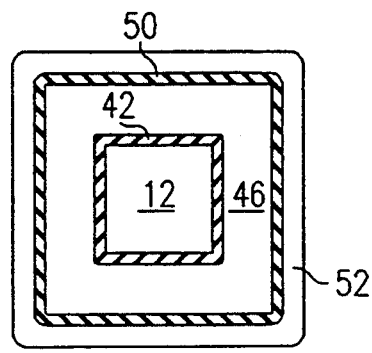

FIG. 1 illustrates a substrate 10 upon which the processing steps depicted in FIGS. 1a–1e2 are performed. Substrate 10 is a P-type semiconductor substrate. As shown in FIG. 1a, substrate 10 is anisotropically etched so as to form structures 12, 12a, 14, and 14a. A memory array contains a plurality of memory cells with these memory cells formed in rows and columns. For clarity, only a few representative memory cells will be described, it being understood that these cells are part of an array of a very large number of such cells.

FIGS. 1b1 and 1b2 are plan views of the structures shown in FIG. 1a. FIGS. 1b1 and 1b2 represent two different embodiments which will be discussed herein. FIG. 1b1 illustrates a "pillar structure" embodiment, and FIG. 1b2 illustrates a "column structure" embodiment. As shown in FIG. 1b1, structures 12 and 14 are pillars, and pillar structures 16 and 18 are also formed by etching substrate 10. It should be understood that the illustrated pillars are part of an array of a very large number of such pillars. To form the pillar structures of FIG. 1b1, columns 20, 22, and 24 are etched so as to create trenches between columns 26 and 28. Rows 30, 32, and 34 are then etched so as to define pillar structure 12–18. With the pillars 12–18 so defined, each will be part of a single memory cell transistor.

The size of these pillars is a function of the design rules for the chip in which the memory cells of the present invention are to be included. The height, depth, and width of these pillars are approximately equal, and equal to the design rule, although they may be different, depending on design considerations. For example, the height may be greater than the other dimensions to accommodate longer channel lengths. Thus, for a 0.5 micron design rule, the pillars may be 0.5 microns in height, depth, and width. The separation between pillars in both the column and row directions may vary depending on design consideration and desired device performance. At a minimum, the separation should be sufficient to accommodate the other layer to be formed between the pillars, to be discussed.

In the column structure embodiment of FIG. 1b2, columns 20, 22, and 24 are etched, resulting in the formation of column structures 12a and 14a, which will each be part of multiple memory cell transistors. It should be understood that the illustrated portions of the column structures are part of a large number of column structures, and that the column structures cross many other rows.

Turning now to FIG. 1c, which represents a cross sectional view for both the pillar structure and column structure embodiments, source regions 36 and drain regions 38 are formed by ion implantation of (N+) dopants as shown. Any conventional (N+) dopants may be used, and in a particular embodiment arsenic, at a concentration of approximately $5 \times 10^{15}$ atoms per square centimeter, is used. Furthermore, anisotropic or directed implant techniques are used, so as to prevent ion implantation on the sidewalls of structures 12, 12a, 14 and 14a. Alternatively, the sidewalls can be masked before source implantation, and this mask then removed.

As an alternative, rather than implanting source regions 36, source regions 40 may be implanted through pillar structures 12 and 14 in the pillar structure embodiment. With source regions 40, no two pillars structures in the same row of pillars share a common source.

The shared sources 36 may be used in a flash EEPROM array, wherein all of the sources are tied to a common node for bulk erasure of cells within an array. With the dedicated sources 40, an EEPROM can be implemented which allows for single bit erasure.

A thin gate oxide layer 42 is grown overlying substrate 10 and pillars 12 and 14. The thickness of oxide layer 14 depends on the type of memory cell to be fabricated. For UV-erasable EPROM cells, the thickness may be approximately 350 Angstroms. For EEPROMs using Fowler-Nordheim tunneling or channel hot electrons for programming, the thickness may be approximately 100 Angstroms. Source and drain regions 36, 38, and 40 may be implanted either before or after gate oxide layer 42 is grown, as ion implantation may be made through the thin gate oxide layer 42. Next, conformal deposition of a conductive layer 44 of polycrystalline or amorphus material comprising silicon is performed. Conductive layer 44 is initially formed to be of a thickness on the order of 3,000 Angstroms, although its thickness depends on the desired characteristics of the memory cells. After deposition, conductive layer 44 is doped if not already conductive as deposited, for example, using $POCl_3$ to render it conductive.

Turning now to FIGS. 1d1 and 1d2, further processing steps are illustrated for both the pillar structure and the column structure embodiments. As shown in both FIGS. 1d1 and 1d2, conductive layer 44 is anisotropically etched using an etchant which is selective to oxide. This etching results in the formation of floating gates 46.

For the pillar structure embodiment, the floating gates 46 shown in FIG. 1d1 will completely surround each of the pillars. As shown in FIG. 1b1, the pillars are shown to be square, it being understood that actual etching processes results in rounded corners. Thus, with pillars 12–18, a floating gate results around each pillar.

For the column structure embodiment shown in FIG. 1d2, the floating gates 46 will run along the sidewalls of the column structures 12a and 14a.

As discussed in connection with FIG. 1c, source regions 36 or 40 may be implanted before conductive layer 44 is deposited. As another alternative, source regions 48, shown in FIGS. 1d1 and 1d2, may be implanted after floating gates 46 are formed. With this alternative, source regions 36 or 40 will not be implanted as shown in FIG. 1c, since source regions 48 are implanted after formation of the floating gates 46. Source regions 48 may be formed using an anisotropic or directed implant.

Next, an oxide-nitride-oxide deposition of insulating layer 50 is deposited overlying the whole structure, as shown in both FIGS. 1d1 and 1d2. Insulating layer 50 is deposited to a thickness of approximately 200 Angstroms. Next, a conformal deposition of conductive layer or layers 52 is performed. Layer 52 may be of polycrystalline or amorphus material or highly conductive silicide or polysilicide layers, for example. Conductive layer 52 forms the control gate for the transistors shown in FIGS. 1d1 and 1d2. Conductive layer 52 is deposited to a thickness of approximately 3000 Angstroms, and is doped so as to be rendered conductive. The thickness of conductive layer 52 may vary depending on the desired characteristics of the memory cells.

Referring now to FIGS. 1b1 and 1d1, the pillar structure embodiment, then the next step after deposition of conductive layer 52 is to etch within rows 30, 32, and 34 down to the gate oxide layer 42 so as to separate rows of memory cells. Thus, each of the pillars in a row, such as pillar structures 12 and 14, share a common control gate. Since the control gate is coupled to the word line, the transistors associated with pillar structures 12 and 14 share the same word line. Similarly, the transistors of pillars 16 and 18 share the same word line. FIG. 2 illustrates a plan view of pillar structure 12 with this embodiment. As shown in FIG. 2, pillar structure 12 is surrounded by gate oxide 42, surrounding floating gate 46, insulating layer 50, and conductive layer 52. As discussed, the surrounding floating gate is formed from conductive layer 46, and conductive layer 52 forms the control gate. With the embodiment in which sources 40 have been implanted, then pillar 12 is a single transistor with a source that is shared by other transistors on the same column, and a control gate that is shared by other transistors on the same row. Such an embodiment allows for single bit erasure if the sources are not commonly coupled. With the embodiment in which source regions 36 or 48 are used, transistor 12 shares its source with adjacent transistors on the same row and column. Thus, all of these source lines may be commonly coupled for implementation in a flash EEPROM.

Figure 3:
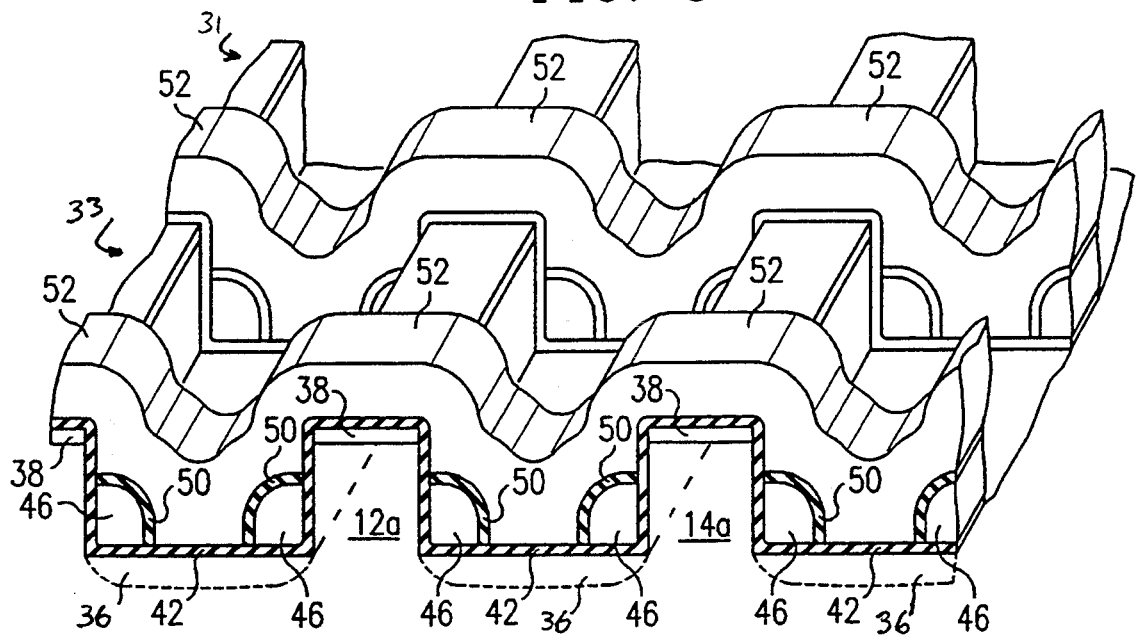
FIG. 3 is an isometric view of another embodiment of representative memory cells according to the teachings of the present invention.

With the column structure embodiment of FIGS. 1b2 and 1d2, an etch is made after deposition of conductive layer 52, to separate each row as shown in FIG. 3. The etching is down to the gate oxide layer 42, as shown along rows 31 and 33, and results in the structure shown in FIG. 3. As shown in FIG. 3, along each of the opposite sidewalls of column structures 12a and 14a are gate oxide 42, floating gates 46, insulating layer 50, and conductive layer 52. With this column structure embodiment, two transistors are formed on opposite walls of the column structures. The transistors on each side of each column structure share a common drain 38. Thus, a "contactless" cell results, since both the drains and sources are buried at the cell cite. Furthermore, each transistor of the column structure embodiment shares a source with transistors on the adjacent side of the next column structure.

Returning now to FIGS. 1d1 and 1d2, a passivation layer 54 is laid down by conformal deposition of oxide. This passivation layer 54 will cover the entire structures shown in FIG. 1b1 and 1b2, and performs two functions. First, it passivates conductive layer 52, and each of the other conductive layers (control gates) on successive rows. Furthermore, it isolates the control gates of each row from each other.

As shown in FIG. 1d1, for the pillar structure embodiment, openings are next made through passivation layer 54 to allow for contact to the drains 38. A sidewall insulator layer 56 is deposited on these openings to isolate conductive layer 52. Finally, metal contacts 58 are provided for contact to the drains 38.

As shown in FIG. 1d2, no drain contract opening is required at each cell cite for the column structure embodiment, since the drains run along the column structure, and can be contacted outside of the array or every few cells. This provides an important technical advantage of reduced complexity.

FIGS. 1e1 and 1e2 illustrate the same structure as that shown in FIGS. 1d1 and 1d2, with the exception that conductive layer 44 is etched for a longer period of time, resulting in smaller floating gates 46. With this embodiment, a portion of the channel of each transistor will not be directly adjacent to the floating gate 46. Instead, that portion of the channel will be directly adjacent to the control gate (conductive layer 52). In this embodiment, the control gate has a step in which it steps down towards the channel of each transistor. This step gate provides the important technical advantage of ameliorating the effects of over-erasure. With over-erasure, the channel under the floating gate can go into the depletion mode with a negative threshold voltage, thus causing failure due to conduction between columns and loss of isolation even at a control gate voltage of zero. With the step gate shown in FIGS. 1e1 and 1e2, at least a portion of the channel directly adjacent to the control gate will not be depleted with over-erasure, thereby ameliorating the effects of over-erasure. An important technical advantage of the present invention is that the step gate configuration results from non-complex etching. Thus, the highly advantageous step gate is achieved without the lithographic alignment and other alignment tolerance problems arising when fabricating step gates in conventional transistors.

With all of the above described embodiments, the channels of the memory cell transistors are substantially vertical to the face of substrate 10, thus allowing significant reductions in area over prior art memory cells, wherein the channels are formed on and parallel to the face of the substrate. Furthermore, the performance of the memory cell transistors of the present invention is improved over prior art cells. Because the channels are substantially vertical, for given device densities, their width is greater than existing cells, providing greater sense current, which results in faster operation. Thus, memory cell transistors according to the present invention have favorable channel W/L ratios.

Figure 4A:
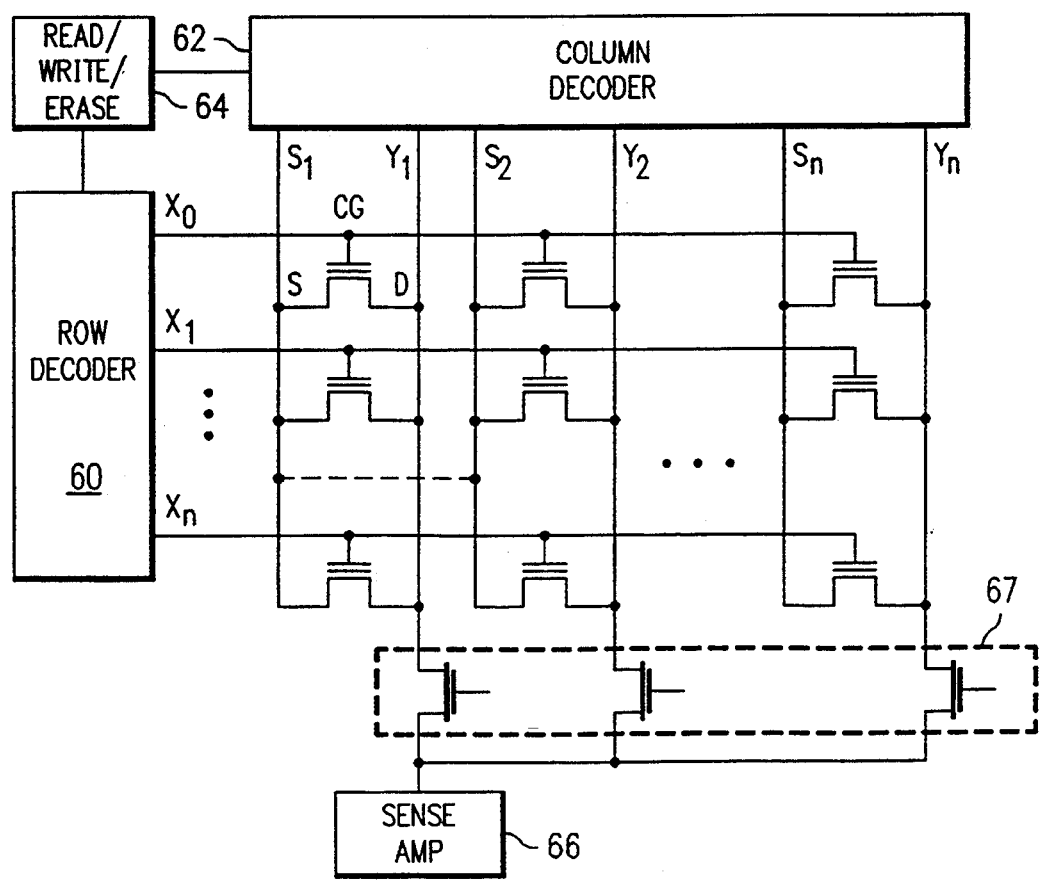
FIGS. 4a–4b are schematic circuit diagrams of memory circuits including arrays of memory cells, all according to the teachings of the present invention.
Figure 4B:
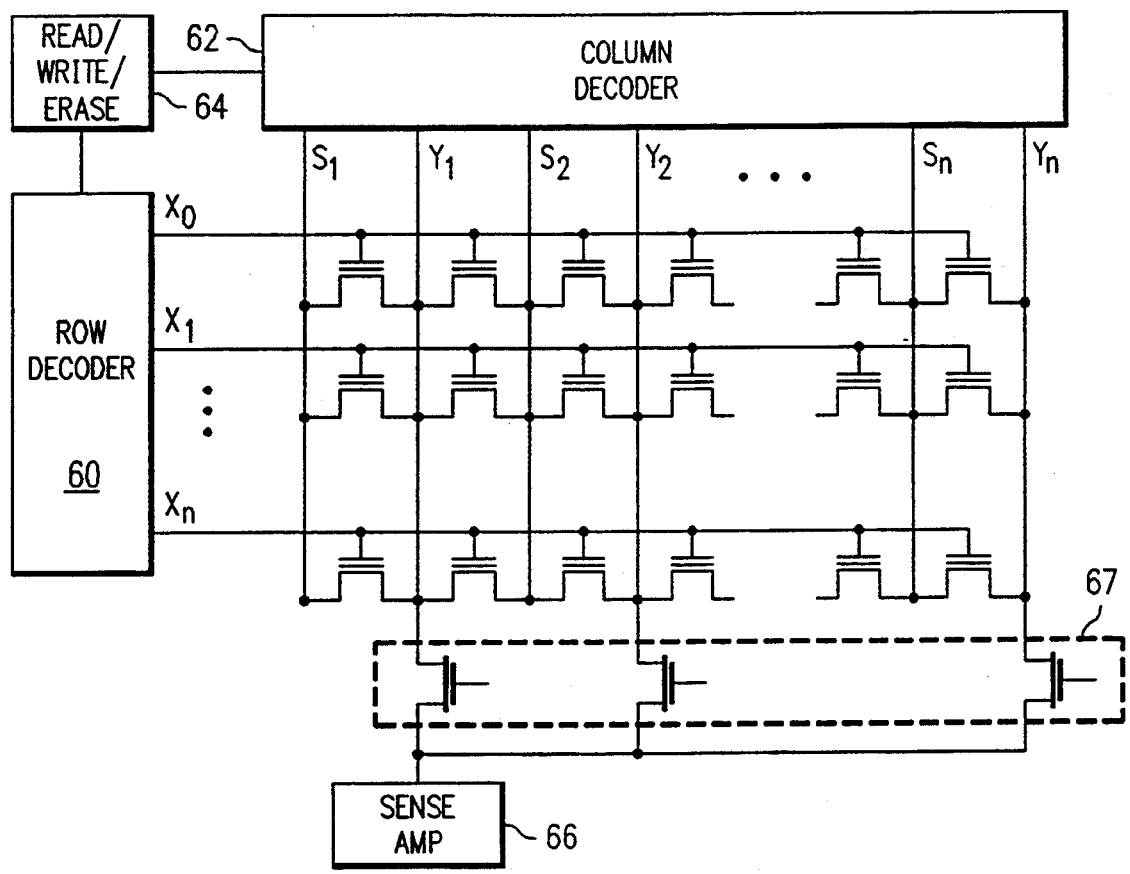

FIGS. 4a and 4b illustrate memory arrays constructed according to the teachings of the present invention. FIG. 4a illustrates an array of memory cells constructed according to the pillar structure embodiment. As shown, a circuit is provided in which a row decoder 60 and column decoder 62 are coupled to a read/write/erase circuit 64. Row decoder 60, column decoder 62, and read/write/erase circuit 64 operate to generate appropriate voltages to allow for reading, writing (programming), or erasing of cells within the array. The row decoder generates signals on word lines $X_0, X_1 \ldots X_n$. These word lines are coupled to the control gates of each of the memory cells on a particular row. A column decoder 62 generates voltages on bit lines $Y_1, Y_2 \ldots Y_n$. These bit lines are coupled to the drains of each transistor on a particular column of pillars.

The sources of each of the memory cells within the array are coupled to source lines $S_1, S_2 \ldots S_n$. The source lines may be separate, for the embodiment in which sources 40 are used, or pairs of the source lines may be coupled together as shown by the dotted lines in FIG. 4a, for the embodiments in which shared sources 36 or 48 are used.

Particular memory cells are read by a sense amp 66 through pass gate transistors 67. Following is a table of various voltages generated by row decoder 60 and column decoder 62 for reading, programming, and erasing memory cells. Erasing for the UV erasable embodiments, of course, is by ultra-violet light.

|  | READ | WRITE | FLASH ERASE |
|---|---|---|---|
| Selected Wordline | 5 V | 12 V | 0 V |
| Deselected Wordlines | 0 V | 0 V | — |
| Selected Drain Line | 1.0 | 5–10 V | Float |
| Deselected Drain Lines | 0 V/Float | 0 V/Float | — |
| Selected Source | 0 V | $\approx$0 V | 10–15 V |
| Deselected Source Lines | Float | Float | — |

FIG. 4b illustrates an array in which the column structure embodiment of memory cells is used. The decoding circuitry is similar to that of FIG. 4a. In this embodiment, however, each bit line is shared, since, as described above, one column structure, with one drain, has pairs of transistors along its sidewalls. Furthermore, the source lines are also shared as shown. This column structure array embodiment is of the virtual ground type, as described, for example, in U.S. Pat. No. 4,281,397, issued Jul. 28, 1981, to Joseph H. Neal, et al., entitled Virtual Ground MOS EPROM or ROM Matrix, and assigned to Texas Instruments Incorporated, which is herein incorporated by reference.

Figure 5:
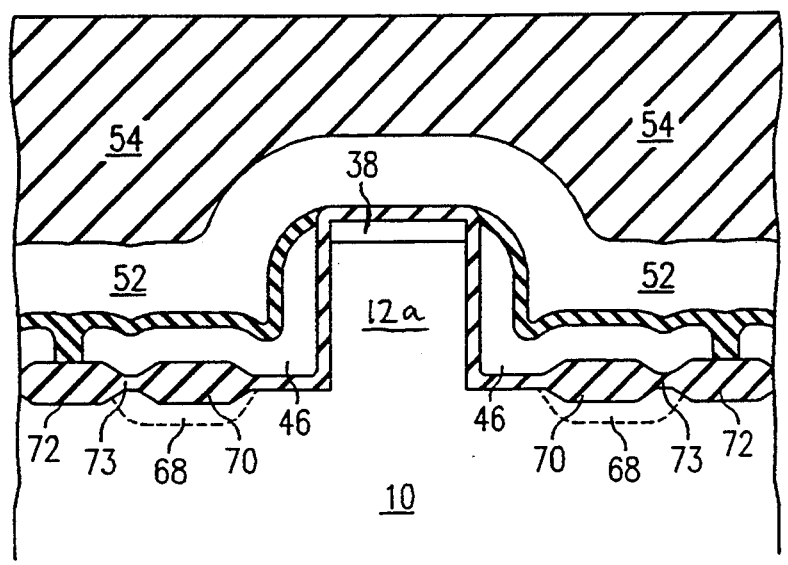
FIG. 5 illustrates a schematic cross sectional view of a particular embodiment of representative memory cells according to the teachings of the present invention, including remote tunneling windows.

FIG. 5 illustrates an embodiment of the present invention in which the devices as shown in FIGS. 1d1, 1d2, 1e1, and 1e2 are formed with a remote tunneling window. With this embodiment, programming and erasing are both provided through the remote tunneling window and thus both programming and erasing are performed using Fowler-Nordheim tunneling.

The fabrication steps and operations of a particular remote tunneling window have been fully described in U.S. Pat. No. 5,008,721, issued Apr. 16, 1991 to Manzur Gill, et al., entitled Electrically-Erasable, Electrically Programmable Read-Only Memory Cell With Self Aligned Tunnel, and assigned to Texas Instruments Incorporated, which is herein incorporated by reference. The illustrated remote tunneling window as shown in FIG. 5 corresponds to the column structure embodiment. It should be understood, however, that remote tunneling windows may also be provided for the pillar structure embodiment, in which case only one remote tunneling window is needed for each pillar structure.

As shown in FIG. 5, source regions 68 are implanted beneath thick thermal silicon oxide layers 70. Strips 72 of LOCOS thick field oxide separate source regions 68 from adjacent source regions. A tunneling window 73 is formed between oxide regions 70 and 72, since the silicon oxide between the source 68 and the floating gate 46 is very thin, approximately 100 Angstroms.

This thin tunneling window 73 allows programming and erasing by tunneling. The floating gates are formed from conductive layer 44, and are terminated over oxide region 72 for separation of each floating gate. With this embodiment, the spacing between the column structures will be increased to allow for the remote tunneling windows.

In summary, memory cell transistors and methods of fabricating these cells are disclosed which provide significant advances over existing memory cells. By forming memory cell transistors around pillar structures or on the sidewalls of column structures, significant area savings are achieved, since the channels are substantially perpendicular to the face of the substrate on which the memory cells are formed. Furthermore, these transistors have favorable channel W/L ratios, providing significant performance gains.

Although the present invention and its advantages has been described in detail, it should be understood that various changes, alterations or substitutions can be made without departing from the intended scope of the present invention as defined by the appended claims.

What is claimed is:

1. A method of forming a memory cell at a semiconductor layer of a first conductivity type, comprising the steps of:

etching the semiconductor layer to form an elongate column structure, the elongate column structure having a base at a face of the semiconductor layer and further having sidewalls;

implanting a source region into the face with a dopant to be of a second conductivity type opposite the first conductivity type;

implanting a drain region into the elongate column structure with a dopant to be of a second conductivity type opposite the first conductivity type to define a channel area extending between the source and drain regions and within the elongate column structure;

forming a floating gate on a portion of one of the sidewalls of the elongate column structure, the floating gate insulatively disposed over at least a part of the channel area; and forming a control gate insulatively disposed adjacent the floating gate.

2. The method of claim 1, wherein said control gate is formed in a direction perpendicular to said elongate column structure.

3. The method of claim 1, wherein said source region is a part of a source line.

4. The method of claim 1, wherein said drain region is a part of a bit line.

5. The method of claim 2, wherein said control gate is a part of a row line.

* * * * *